(12) United States Patent
Kim et al.

(10) Patent No.: US 10,305,467 B2
(45) Date of Patent: May 28, 2019

(54) RADIO FREQUENCY SWITCH CIRCUIT

(71) Applicant: SAMSUNG ELECTRO-MECHANICS CO., LTD., Suwon-si (KR)

(72) Inventors: Yoo Hwan Kim, Suwon-si (KR); Jong Mo Lim, Suwon-si (KR); Yoo Sam Na, Suwon-si (KR); Hyun Jin Yoo, Suwon-si (KR); Hyun Hwan Yoo, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/693,702

(22) Filed: Sep. 1, 2017

(65) Prior Publication Data

US 2018/0145679 A1    May 24, 2018

(30) Foreign Application Priority Data

Nov. 18, 2016 (KR) .......................... 10-2016-0154185

(51) Int. Cl.
| | |
|---|---|
| H03K 17/16 | (2006.01) |
| H01Q 1/24 | (2006.01) |
| H03K 17/14 | (2006.01) |
| H01P 1/213 | (2006.01) |
| H03K 17/06 | (2006.01) |
| H03K 17/693 | (2006.01) |

(52) U.S. Cl.
CPC ........... *H03K 17/162* (2013.01); *H01P 1/213* (2013.01); *H01Q 1/248* (2013.01); *H03K 17/063* (2013.01); *H03K 17/145* (2013.01); *H03K 17/693* (2013.01); *H03K 2017/066* (2013.01); *H03K 2217/0081* (2013.01)

(58) Field of Classification Search
CPC .................................................. H03K 17/162
See application file for complete search history.

(56) References Cited

U.S. PATENT DOCUMENTS

| | | | |
|---|---|---|---|
| 6,512,400 B1* | 1/2003 | Forbes ............... | H03F 3/45183 327/563 |
| 9,225,378 B2 | 12/2015 | Burgener et al. | |
| 2012/0300349 A1* | 11/2012 | Abou-Khalil ......... | H02H 9/046 361/56 |
| 2015/0188600 A1 | 7/2015 | Kang et al. | |
| 2016/0156345 A1* | 6/2016 | Jang ..................... | H03K 17/161 327/379 |

FOREIGN PATENT DOCUMENTS

| | | |
|---|---|---|
| JP | 2012-034103 A | 2/2012 |
| KR | 10-2015-0076827 A | 7/2015 |

* cited by examiner

*Primary Examiner* — Daniel C Puentes
(74) *Attorney, Agent, or Firm* — NSIP Law

(57) ABSTRACT

A radio frequency switch circuit includes: a radio frequency switch configured to control a radio frequency signal passing between a signal port and an antenna port; a first buffer configured to generate the first control voltage in response to a second control voltage; a second buffer configured to receive a third control voltage and configured to generate the second control voltage in response to the third control voltage; a first power supplier configured to supply a first high voltage to the first buffer and configured to supply a second high voltage to the second buffer; and a second power supplier configured to supply a first low voltage to the first buffer and configured to supply a second low voltage to the second buffer.

20 Claims, 4 Drawing Sheets

RADIO FREQUENCY SWITCH CIRCUIT

CROSS-REFERENCE TO RELATED APPLICATION(S)

This application claims the benefit under 35 USC 119(a) of Korean Patent Application No. 10-2016-0154185, filed on Nov. 18, 2016 in the Korean Intellectual Property Office, the entire disclosure of which is incorporated herein by reference for all purposes.

BACKGROUND

1. Field

The following description relates to a radio frequency switch circuit.

2. Description of Related Art

As wireless communications technology advances, various communication standards are being integrated into single electronic devices. For instance, radio frequency switch circuits may control the movement of respective radio frequency signals of various communications standards to support smooth communications of electronic devices.

Radio frequency switches are controlled to be turned on or off based on control voltages so as to control radio frequency signals passing between signal ports and antenna ports to pass or be blocked. When an actual control voltage deviates from a set voltage, radio frequency switches may not be fully turned off to be in an off state. Accordingly, the linearity characteristics or noise characteristics of radio frequency switches may deteriorate.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a radio frequency switch circuit includes: a first radio frequency switch controlled to be turned on or off according to a first control voltage so as to control a radio frequency signal passing between a signal port and an antenna port to pass or be blocked; a first buffer generating the first control voltage according to a second control voltage; a second buffer configured to receive a third control voltage and generating the second control voltage according to the third control voltage; a first power supplier supplying a first high voltage to the first buffer and supplying a second high voltage to the second buffer; and a second power supplier supplying a first low voltage to the first buffer and supplying a second low voltage to the second buffer, in which a first voltage difference between the first high voltage and the first low voltage is different from a second voltage difference between the second high voltage and the second low voltage.

The first voltage difference may be lower than the second voltage difference, and the first high voltage may be lower than the second high voltage.

The first and second low voltages may be negative.

The second power supplier may comprise a negative voltage generator generating the first and second low voltages; and a filter filtering the first and second low voltages.

The radio frequency switch circuit may further comprise a decoder generating a control logic value; and a level shifter generating the third control voltage according to the control logic value.

The first power supplier may supply the second high voltage and the second low voltage to the level shifter.

The radio frequency switch circuit may further comprise a third buffer configured to receive a fourth control voltage and generating the third control voltage in response to the fourth control voltage, wherein the first power supplier supplies a third high voltage to the third buffer, and the second power supplier supplies a third low voltage to the third buffer.

A third voltage difference between the third high voltage and the third low voltage may be greater than the first voltage difference and the second voltage difference.

The radio frequency switch circuit may further comprise a second radio frequency switch electrically connected to the radio frequency switch and controlled to be turned on or off in response to the first control voltage.

The first buffer may comprise a first transistor configured to receive the second control voltage, configured to receive the first high voltage or the first low voltage, and outputting the first control voltage, the second buffer may comprise a second transistor configured to receive the third control voltage, configured to receive the second high voltage or the second low voltage, and outputting the second control voltage, and a size (W/L) of the first transistor may be larger than a size (W/L) of the second transistor.

A portion of the first to third control voltages may have a value closer to the first or second low voltage than to the first or second high voltage, and a remainder of the first to third control voltages may have a value closer to the first or second high voltage than to the first or second low voltage.

The radio frequency switch circuit may further comprise a temperature sensor configured to sense a temperature and generating a temperature signal corresponding to the sensed temperature, wherein the first power supplier adjusts the first or second high voltage such that a difference value between the first voltage difference and the second voltage difference corresponds to the temperature signal, and adjusts the first or second high voltage such that the difference value is increased as the temperature sensed by the temperature sensor is increased.

In another general aspect, a radio frequency switch circuit includes: a first radio frequency series switch receiving a first series control voltage and controlled to be turned on or off according to the first series control voltage so as to control a radio frequency signal passing between a first signal port and an antenna port to pass or be blocked; a first radio frequency shunt switch connected to the first signal port, receiving a first shunt control voltage, and controlled to be turned on or off according to the first shunt control voltage; a first shunt buffer receiving a second shunt control voltage and generating the first shunt control voltage according to the second shunt control voltage; a second shunt buffer receiving a third shunt control voltage and generating the second shunt control voltage according to the third shunt control voltage; a first power supplier supplying a first high voltage to the first shunt buffer and supplying a second high voltage to the second shunt buffer; and a second power supplier supplying a first low voltage to the first shunt buffer and supplying a second low voltage to the second shunt buffer, in which a first voltage difference between the first high voltage and the first low voltage is different from a second voltage difference between the second high voltage and the second low voltage.

The radio frequency switch circuit may further comprise a second radio frequency series switch receiving the first shunt control voltage and controlled to be turned on or off according to the first shunt control voltage so as to control a radio frequency signal passing between a second signal port and the antenna port to pass or be blocked.

The radio frequency switch circuit may further comprise a second radio frequency shunt switch connected to the second signal port, receiving the first series control voltage, and controlled to be turned on or off according to the first series control voltage.

The radio frequency switch circuit may further comprise a first series buffer receiving a second series control voltage and generating the first series control voltage according to the second series control voltage; and a second series buffer receiving a third series control voltage and generating the second series control voltage according to the third series control voltage, wherein the first power supplier supplies the first high voltage to the first series buffer and supplies the second high voltage to the second series buffer, and the second power supplier supplies the first low voltage to the first series buffer and supplies the second low voltage to the second series buffer.

In another general aspect, a radio frequency switch circuit includes a radio frequency switch configured to control a radio frequency signal between a signal port and an antenna port; and buffers connected in series each to the other for generating a first control voltage to control the radio frequency switch, each of the buffers receiving a high voltage and a low voltage, wherein a first voltage difference between a first high voltage of a first buffer of the buffers and a first low voltage of the first buffer is different from a second high voltage of a second buffer of the buffers and a second low voltage of the second buffer.

The first voltage difference may be lower than the second voltage difference, and the first high voltage may be lower than the second high voltage.

The radio frequency switch circuit may further comprise a decoder generating a control logic value; and a level shifter generating an input control voltage to the buffers based on the control logic value.

The first buffer may comprise a first transistor receiving a second control voltage, receiving the first high voltage and the first low voltage, and outputting the first control voltage, the second buffer may comprise a second transistor receiving the input control voltage, receiving the second high voltage and the second low voltage, and outputting the second control voltage, and a size (W/L) of the first transistor may be larger than a size (W/L) of the second transistor.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1:
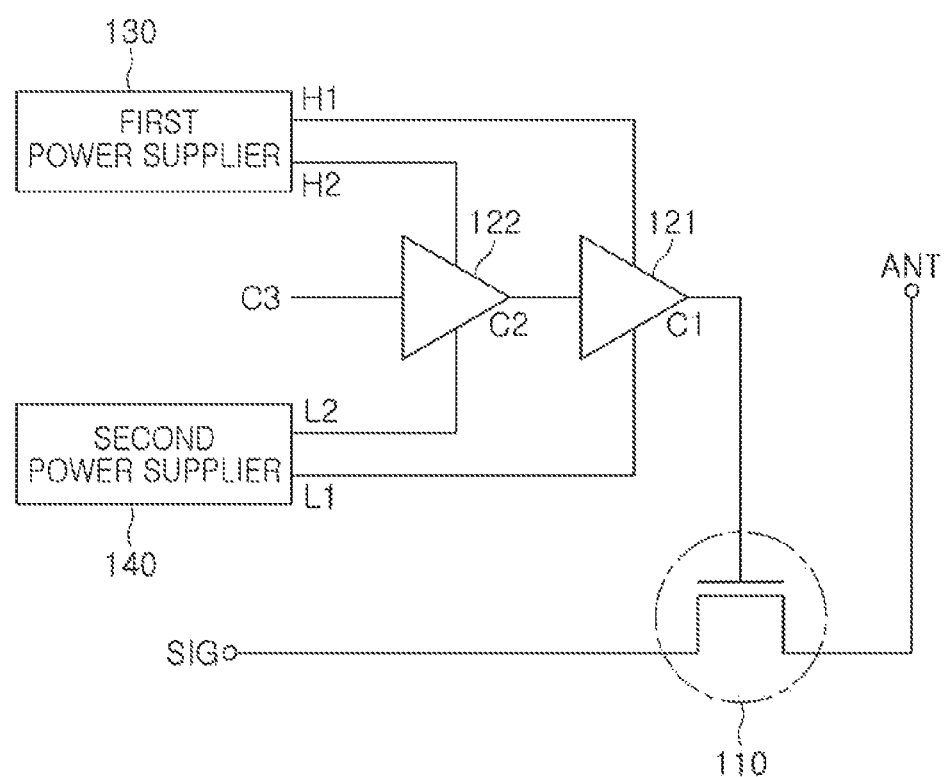
FIG. 1 is a circuit diagram of a radio frequency switch circuit according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above"

or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a circuit diagram of a radio frequency switch circuit according to an example.

Referring to FIG. 1, the radio frequency switch circuit, according to the example, includes a radio frequency switch 110, a first buffer 121, a second buffer 122, a first power supplier 130, and a second power supplier 140.

The radio frequency switch 110 is controlled to be turned on or off according to a first control voltage C1 so as to control a radio frequency signal passing between a signal port SIG and an antenna port ANT to pass or be blocked.

When the radio frequency switch 110 is implemented as a field-effect transistor, the radio frequency switch 110 receives the first control voltage C1 through a gate terminal, and passes the radio frequency signal between a source terminal and a drain terminal when turned on and blocks the radio frequency signal when turned off. Electrical resistance of the radio frequency switch 110 to the radio frequency signal is decreased as the first control voltage C1 is increased. Thus, the radio frequency switch 110 is turned off when the first control voltage C1 is low, and is turned on when the first control voltage C1 is high.

For example, the radio frequency switch 110 may be implemented as a silicon semiconductor, a compound semiconductor, or graphene, and may be implemented as a silicon-on-insulator (SOI) in order to reduce the effects of parasitic elements. Further, the radio frequency switch 110 may be implemented as a three-terminal transistor such as a bipolar junction transistor (BJT) or an FET having a body terminal.

The first buffer 121 generates the first control voltage C1 in response to a second control voltage C2. The first buffer 121 improves the response characteristics of the first control voltage C1 by enhancing the on or off state change characteristics of the high frequency switch 110. Namely, the first buffer 121 supports seamless control of the second control voltage C2 with respect to the radio frequency switch 110 to improve the response characteristics of the first control voltage C1.

The second buffer 122 receives a third control voltage C3 and generates the second control voltage C2 according to the third control voltage C3. The second buffer 122 improves the response characteristics of the second control voltage C2 by enhancing the on or off state change characteristics of the high frequency switch 110 according to the third control voltage C3. Namely, the second buffer 122 supports seamless control of the third control voltage C3 with respect to the radio frequency switch 110.

The first power supplier 130 supplies a first high voltage H1 to the first buffer 121 and a second high voltage H2 to the second buffer 122.

The second power supplier 140 supplies a first low voltage L1 to the first buffer 121 and a second low voltage L2 to the second buffer 122.

In other words, the first power supplier 130 and the second power supplier 140 generate voltages to be applied to the first buffer 121 and the second buffer 122 and supply the generated voltages to the first buffer 121 and the second buffer 122.

Further, the first power supplier 130 and the second power supplier 140 appropriately set voltages to be supplied to the first buffer 121 and the second buffer 122 to determine operating conditions of the first buffer 121 and the second buffer 122. Control voltages input to or output from the first buffer 121 and the second buffer 122 are affected by the operating conditions.

When the voltages supplied by the first power supplier 130 and the second power supplier 140 are not appropriately set, leakage currents are generated in the first buffer 121 and the second buffer 122. The leakage currents not only increase power consumption of the first buffer 121 and the second buffer 122, but also affect the control voltages input to or output from the first buffer 121 and the second buffer 122.

When temperatures of the first buffer 121 and the second buffer 122 change, magnitudes of the leakage currents are further increased. Namely, when the voltages supplied by the first power supplier 130 and the second power supplier 140 are not appropriately set, the operating conditions and the control voltages of the first buffer 121 and the second buffer 122 become sensitive to temperature.

Thus, the first power supplier 130 and the second power supplier 140 set the supply voltages such that a first voltage difference between the first high voltage H1 and the first low voltage L1 is different from a second voltage difference between the second high voltage H2 and the second low voltage L2. Namely, the first power supplier 130 and the second power supplier 140 set at least one of the first high voltage H1 and the first low voltage L1 such that the at least one of the first high voltage H1 and the first low voltage L1 is different from the second high voltage H2 and the second low voltage L2, respectively.

For example, the leakage current generated in the second buffer 122 may cause variations of the second control voltage C2, and the variations of the second control voltage C2 increases the magnitude of the leakage current generated in the first buffer 121. Thus, the first power supplier 130 and the second power supplier 140 set the supply voltages such that the first voltage difference is lower than the second voltage difference so as to reduce the magnitude of the leakage current generated in the first buffer 121.

Accordingly, the radio frequency switch circuit, according to the example, reduces a phenomenon in which an actual first control voltage C1 deviates from a set voltage for the off state and improves linearity characteristics or noise characteristics.

Figure 2:
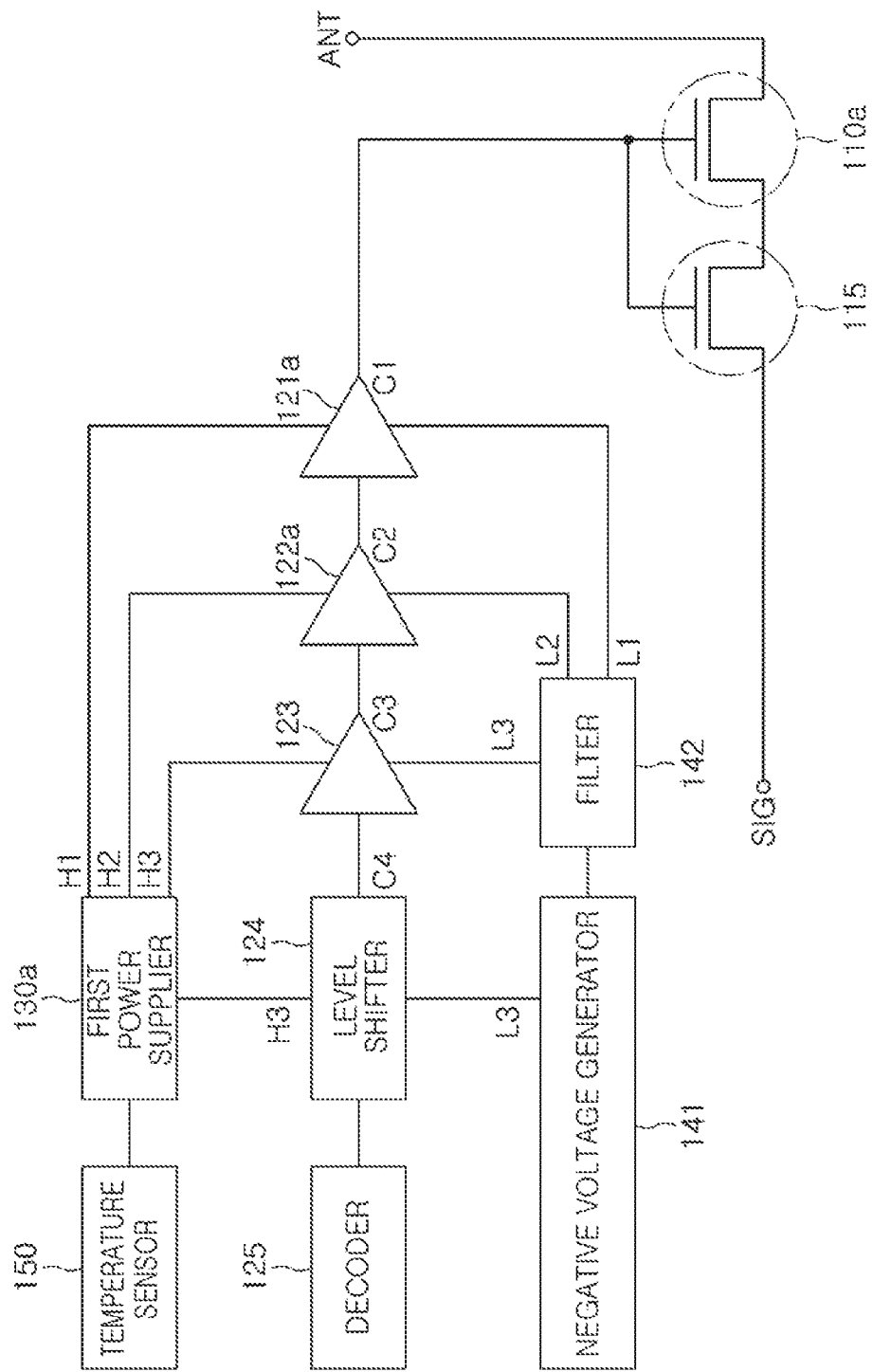
FIG. 2 is a circuit diagram of an additional configuration that is included in a radio frequency switch circuit according to an example.

FIG. 2 is a circuit diagram of an additional configuration that is included in a radio frequency switch circuit according to an example.

Referring to FIG. 2, the radio frequency switch circuit, according to the example, further includes a second radio frequency switch 115, a third buffer 123, a level shifter 124, a decoder 125, a negative voltage generator 141, a filter 142, and a temperature sensor 150.

The second radio frequency switch 115 is electrically connected to a first radio frequency switch 110a and controlled to be turned on or off according to the first control voltage C1. In other words, the second radio frequency switch 115 is connected to the first radio frequency switch 110a in series and has the same on-off states as those of the first radio frequency switch 110a.

The third buffer 123 receives a fourth control voltage C4 and generates the third control voltage C3 according to the fourth control voltage C4. Namely, the buffers included in the radio frequency switch circuit, according to the example, are provided in plural.

In an example, a first power supplier 130a supplies a third high voltage H3 to the third buffer 123, and a second power supplier supplies a third low voltage L3 to the third buffer 123.

For example, a third voltage difference between the third high voltage H3 and the third low voltage L3 are greater than the first voltage difference and the second voltage difference. Accordingly, based on changes in temperature, a gradual increase in leakage currents flowing in the first buffer 121 and the second buffer 122 is controlled.

The level shifter 124 receives a control logic value and generates the fourth control voltage C4 based on the control logic value. The level shifter 124 receives the third high voltage H3 from the first power supplier 130a to generate the fourth control voltage C4 and may receive the third low voltage L3 from the second power supplier.

The decoder 125 generates the control logic value. For example, the decoder 125 may receive a binary code from the outside of the radio frequency switch circuit or store a binary code in advance. The decoder 125 decodes the received binary code or the stored binary code to generate the control logic value.

The second power supplier includes the negative voltage generator 141 and the filter 142.

The negative voltage generator 141 generates the first to third low voltages L1 to L3, which are negative voltages. Here, the negative voltages refer to voltages having a level lower than that of a direct current (DC) voltage of a wire through which the radio frequency signal passes. Further, the first to third low voltages L1 to L3 may be the same as each other.

The negative voltage generator 141 supplies the negative voltages to the first to third buffers 121a, 122a, and 123, and thus the first to third control voltages C1 to C3 have a value of 0 V or lower. Accordingly, the first radio frequency switch 110a and the second radio frequency switch 115 are fully turned off; thus, improving linearity characteristics or noise characteristics of the radio frequency switch circuit.

The filter 142 filters the first to third low voltages L1 to L3 in low-pass filter fashion to remove noise, such as harmonics or the like, included in an output of the negative voltage generator 141. For example, the filter 142 may be an RC filter including a resistor and a capacitor. The leakage current from the first to third buffers 121a, 122a, and 123, to which the first to third low voltages L1 to L3 will be supplied, flows to the resistor included in the filter 142.

When the first power supplier 130a sets the first to third high voltages H1 to H3 to have different values, a magnitude of the leakage current flowing in the filter 142 is decreased, and thus the radio frequency switch circuit is robust to temperature changes.

The temperature sensor 150 senses a temperature and generates a temperature signal corresponding to the sensed temperature. For example, the temperature sensor 150 generates a current varying according to the temperatures by using a band gap reference. The current is the temperature signal.

Further, the first power supplier 130a may adjust the first or second high voltage H1 or H2 based on the temperature signal. In one example, the first power supplier 130a adjusts the first or second high voltage H1 or H2, such that a voltage difference between the first high voltage H1 and the second high voltage H2 is increased, as the temperature sensed by the temperature sensor 150 is increased.

The radio frequency switch circuit, according to the example, allows for amplification of the radio frequency signal, and heat caused by power consumption. Thus, the temperature change of the radio frequency switch circuit accommodated is large. The first power supplier 130a sets the supply voltages flexibly according to the temperature change; thus, further improving the temperature robustness of the radio frequency switch circuit.

Figure 3:
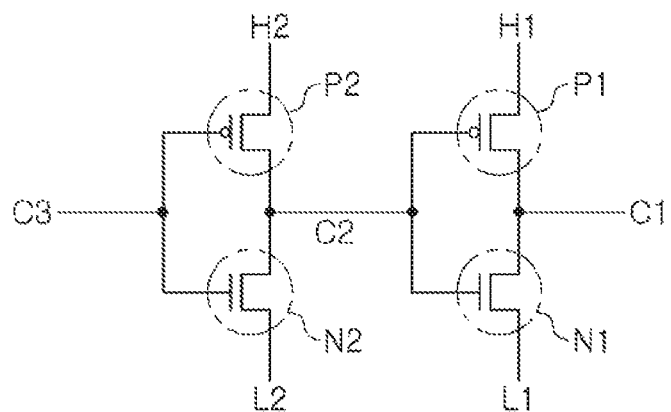
FIG. 3 is a circuit diagram of first and second buffers that are included in a radio frequency switch circuit according to an example.

FIG. 3 is a circuit diagram of first and second buffers that are included in a radio frequency switch circuit according to an example.

Referring to FIG. 3, the first buffer includes a first N-type transistor N1 and a first P-type transistor P1, and the second buffer includes a second N-type transistor N2 and a second P-type transistor P2.

The first N-type transistor N1 receives a second control voltage C2, receives a first low voltage L1, and outputs a first control voltage C1.

The first P-type transistor P1 receives the second control voltage C2, receives a first high voltage H1, and outputs the first control voltage C1.

The second N-type transistor N2 receives a third control voltage C3, receives a second low voltage L2, and outputs a second control voltage C2. A size (W/L) of the second N-type transistor N2 is smaller than that of the first N-type transistor N1.

The second P-type transistor P2 receives the third control voltage C3, receives a second high voltage H2, and outputs the second control voltage C2. A size (W/L) of the second P-type transistor P2 is smaller than that of the first P-type transistor P1. Accordingly, the first and second buffers seamlessly control on-off states of a radio frequency switch.

The size (W/L) refers to a relative size of a channel width with respect to a channel length of the transistor.

The first N-type transistor N1 and the first P-type transistor P1 may be an inverter generating the first control voltage C1 having logic opposite that of the second control voltage C2.

Thus, one of the first and second control voltages C1 and C2 may have a low value closer to the first or second low voltage L1 or L2 than to the first or second high voltage H1 or H2, and the other of the first and second control voltages C1 and C2 may have a high value closer to the first or second high voltage H1 or H2 than to the first or second low voltage L1 or L2.

Figure 4:
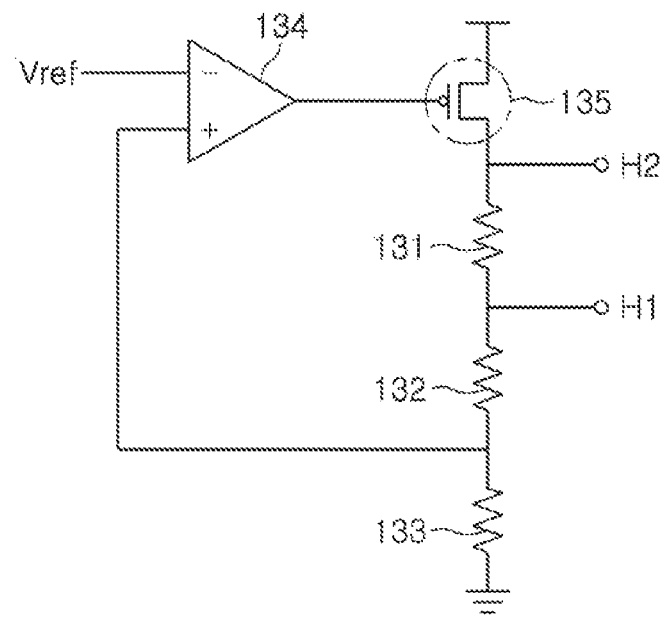
FIG. 4 is a circuit diagram of a first power supplier that is included in a radio frequency switch circuit according to an example.

FIG. 4 is a circuit diagram of a first power supplier that is included in a radio frequency switch circuit according to an example.

Referring to FIG. 4, the first power supplier includes a first resistor 131, a second resistor 132, a third resistor 133, an operational amplifier 134, and an output transistor 135.

The first to third resistors 131 to 133 determine first and second high voltages H1 and H2 according to the relationship between resistance values thereof.

The operational amplifier 134 receives a voltage between the second resistor 132 and the third resistor 133 and a reference voltage Vref and transfers an output voltage to the output transistor 135.

The output transistor 135 receives the output voltage through a gate terminal, receives a power voltage through a source terminal, and outputs the first high voltage H1 through a drain terminal.

Namely, the operational amplifier 134 and the output transistor 135 have a feedback relationship for the first to third resistors 131 to 133. Accordingly, the operational amplifier 134 and the output transistor 135 control the first and second high voltages H1 and H2 such that the first and second high voltages H1 and H2 are nearly impervious to variations of the power voltage.

Figure 5:
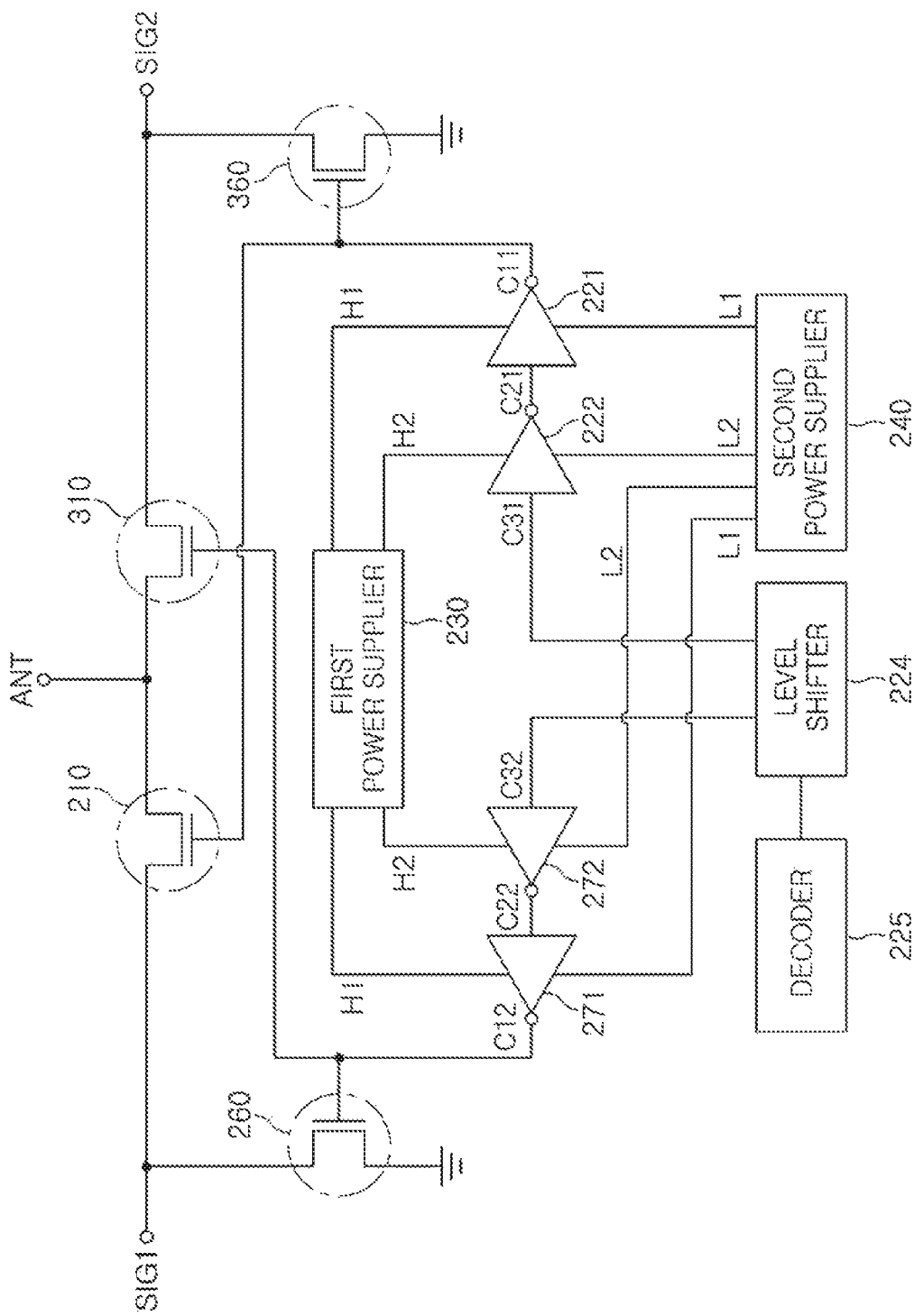
FIG. 5 is a circuit diagram of a radio frequency series switch and a radio frequency shunt switch that are included in a radio frequency switch circuit according to an example.

FIG. 5 is a circuit diagram of a radio frequency series switch and a radio frequency shunt switch that are included in a radio frequency switch circuit according to an example.

Referring to FIG. 5, the radio frequency switch circuit, according to the example, includes a first radio frequency series switch 210, a first power supplier 230, a second power supplier 240, a first radio frequency shunt switch 260, a first shunt buffer 271, and a second shunt buffer 272.

The first radio frequency series switch 210 receives a first series control voltage C11 and is controlled to be turned on or off according to the first series control voltage C11 so as to control a radio frequency signal passing between a first signal port SIG1 and an antenna port ANT to pass or be blocked.

The first power supplier 230 generates first and second high voltages H1 and H2. In an example, the first and second high voltages H1 and H2 have different voltage values.

The second power supplier 240 generates first and second low voltages L1 and L2.

The first radio frequency shunt switch 260 is connected to the first signal port SIG1 and a ground, receives a first shunt control voltage C12, and is controlled to be turned on or off according to the first shunt control voltage C12.

The first shunt buffer 271 receives a second shunt control voltage C22 and generates the first shunt control voltage C12 according to the second shunt control voltage C22.

Further, the first shunt buffer 271 receives the first high voltage H1 from the first power supplier 230 and the first low voltage L1 from the second power supplier 240.

The second shunt buffer 272 generates the second shunt control voltage C22 according to a third shunt control voltage C32 received from a decoder 225 or a level shifter 224.

Further, the first shunt buffer 272 receives the second high voltage H2 from the first power supplier 230 and the second low voltage L2 from the second power supplier 240.

Accordingly, the radio frequency switch circuit, according to the example, reduces a phenomenon in which an actual first shunt control voltage C12 deviates from a set voltage for the off state and may improve linearity characteristics or noise characteristics.

Referring to FIG. 5, the radio frequency switch circuit, according to the example, includes a first series buffer 221, a second series buffer 222, a second radio frequency series switch 310, and a second radio frequency shunt switch 360.

The first series buffer 221 receives a second series control voltage C21 and generates the first series control voltage C11 according to the second series control voltage C21.

Further, the first series buffer 221 receives the first high voltage H1 from the first power supplier 230 and the first low voltage L1 from the second power supplier 240. Namely, the first high voltage H1 and the first low voltage L1 are commonly supplied to the first series buffer 221 and the first shunt buffer 271.

The second series buffer 222 generates the second series control voltage C21 according to a third series control voltage C31 received from the decoder 225 or the level shifter 224.

Further, the second series buffer 222 receives the second high voltage H2 from the first power supplier 230 and the second low voltage L2 from the second power supplier 240. Namely, the second high voltage H2 and the second low voltage L2 are commonly supplied to the second series buffer 222 and the second shunt buffer 272.

The second radio frequency series switch 310 receives the first shunt control voltage C12, is controlled to be turned on or off according to the first shunt control voltage C12 so as to control a radio frequency signal passing between a second signal port SIG2 and the antenna port ANT to pass or be blocked. Namely, the first shunt control voltage C12 is commonly transferred to the second radio frequency series switch 310 and the first radio frequency shunt switch 260.

The second radio frequency shunt switch 360 is connected to the second signal port SIG2 and a ground, receives the first series control voltage C11, and is controlled to be turned on or off according to the first series control voltage C11. Namely, the first series control voltage C11 is commonly transferred to the second radio frequency shunt switch 360 and the first radio frequency series switch 210.

When the radio frequency signal passes through the first signal port SIG1 and the antenna port ANT, the first radio frequency series switch 210 and the second radio frequency shunt switch 360 are turned on and the second radio frequency series switch 310 and the first radio frequency shunt switch 260 are turned off. Accordingly, isolation of the radio frequency signal for the second radio frequency series switch 310 is increased.

When the radio frequency signal passes through the second signal port SIG2 and the antenna port ANT, the first radio frequency series switch 210 and the second radio frequency shunt switch 360 are turned off and the second radio frequency series switch 310 and the first radio frequency shunt switch 260 are turned on. Accordingly, isolation of the radio frequency signal for the first radio frequency series switch 210 is increased.

As set forth above, according to the examples, a radio frequency switch circuit reduces a phenomenon in which an actual control voltage deviates from a set voltage, thus increasing linearity characteristics or noise characteristics of a radio frequency switch.

Further, the radio frequency switch circuit reduces a characteristic change rate of the radio frequency switch according to changes in temperature, thus being robust to temperature.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio frequency switch circuit, comprising:
a first buffer configured to generate a first control voltage in response to a second control voltage;
a second buffer connected in series with the first buffer and configured to generate the second control voltage;
a radio frequency switch configured to turn on or off in response to the first control voltage to control a radio frequency signal passing between a signal port and an antenna port;
a first power supplier configured to supply a first high voltage to the first buffer and configured to supply a second high voltage to the second buffer; and
a second power supplier configured to supply a first low voltage to the first buffer and configured to supply a second low voltage to the second buffer,
wherein a first voltage difference between the first high voltage and the first low voltage is different from a second voltage difference between the second high voltage and the second low voltage.

2. The radio frequency switch circuit of claim 1, wherein the second buffer is configured to generate the second control voltage in response to receiving a third control voltage.

3. The radio frequency switch circuit of claim 2, wherein the first voltage difference is lower than the second voltage difference, and the first high voltage is lower than the second high voltage.

4. The radio frequency switch circuit of claim 2, wherein the first and second low voltages are negative.

5. The radio frequency switch circuit of claim 4, wherein the second power supplier comprises:
a negative voltage generator configured to generate the first and second low voltages; and
a filter configured to filter the first and second low voltages.

6. The radio frequency switch circuit of claim 2, further comprising:
a decoder configured to generate a control logic value; and
a level shifter configured to generate the third control voltage according to the control logic value.

7. The radio frequency switch circuit of claim 6, wherein the first power supplier supplies the second high voltage and the second low voltage to the level shifter.

8. The radio frequency switch circuit of claim 2, further comprising:
a third buffer receiving a fourth control voltage and configured to generate the third control voltage in response to the fourth control voltage,
wherein the first power supplier supplies a third high voltage to the third buffer, and the second power supplier supplies a third low voltage to the third buffer.

9. The radio frequency switch circuit of claim 8, wherein a third voltage difference between the third high voltage and the third low voltage is greater than the first voltage difference and the second voltage difference.

10. The radio frequency switch circuit of claim 2, further comprising:
a second radio frequency switch connected to the radio frequency switch and controlled to be turned on or off in response to the first control voltage.

11. The radio frequency switch circuit of claim 2, wherein the first buffer comprises a first transistor receiving the second control voltage, receiving the first high voltage or the first low voltage, and outputting the first control voltage, the second buffer comprises a second transistor receiving the third control voltage, receiving the second high voltage or the second low voltage, and outputting the second control voltage, and a size (W/L) of the first transistor is larger than a size (W/L) of the second transistor.

12. The radio frequency switch circuit of claim 2, wherein a portion of the first to third control voltages has a value closer to the first or second low voltage than to the first or second high voltage, and a remainder of the first to third control voltages has a value closer to the first or second high voltage than to the first or second low voltage.

13. The radio frequency switch circuit of claim 2, further comprising:
a temperature sensor configured to sense a temperature and configured to generate a temperature signal corresponding to the sensed temperature,
wherein the first power supplier adjusts the first or second high voltage such that a difference value between the first voltage difference and the second voltage difference corresponds to the temperature signal, and adjusts the first or second high voltage such that the difference value is increased as the temperature sensed by the temperature sensor is increased.

14. A radio frequency switch circuit, comprising:
a radio frequency series switch configured to receive a first series control voltage and controlled to be turned on or off according to the first series control voltage so as to control a radio frequency signal passing between a signal port and an antenna port;
a first shunt buffer configured to generate a first shunt control voltage in response to receiving a second shunt voltage;
a second shunt buffer connected in series with the first shunt buffer and configured to generate the second shunt control voltage;
a radio frequency shunt switch connected to the signal port, configured to receive the first shunt control voltage, and controlled to be turned on or off according to the first shunt control voltage;
a first power supplier configured to supply a first high voltage to the first shunt buffer and configured to supply a second high voltage to the second shunt buffer; and
a second power supplier configured to supply a first low voltage to the first shunt buffer and configured to supply a second low voltage to the second shunt buffer,
wherein a first voltage difference between the first high voltage and the first low voltage is different from a second voltage difference between the second high voltage and the second low voltage.

15. The radio frequency switch circuit of claim 14, wherein
the second shunt buffer is configured to receive a third shunt control voltage and configured to generate the second shunt control voltage in response to the third shunt control voltage.

16. The radio frequency switch circuit of claim 15, further comprising:
a second radio frequency series switch configured to receive the first shunt control voltage and controlled to be turned on or off according to the first shunt control voltage so as to control a radio frequency signal passing between a second signal port and the antenna port to pass or be blocked.

17. The radio frequency switch circuit of claim 16, further comprising:
a second radio frequency shunt switch connected to the second signal port, configured to receive the first series control voltage, and controlled to be turned on or off according to the first series control voltage.

18. The radio frequency switch circuit of claim 15, further comprising:
a first series buffer configured to receive a second series control voltage and configured to generate the first series control voltage according to the second series control voltage; and
a second series buffer configured to receive a third series control voltage and configured to generate the second series control voltage according to the third series control voltage,
wherein the first power supplier supplies the first high voltage to the first series buffer and supplies the second high voltage to the second series buffer, and the second power supplier supplies the first low voltage to the first series buffer and supplies the second low voltage to the second series buffer.

19. A radio frequency switch circuit, comprising:
a radio frequency switch configured to control a radio frequency signal between a signal port and an antenna port; and
a first buffer and a second buffer connected in series, the first buffer configured to generate a first control voltage to control the radio frequency switch in response to a second control voltage generated by the second buffer, each of the first and second buffers receiving a high voltage and a low voltage,
wherein a first voltage difference between a first high voltage of the first buffer and a first low voltage of the first buffer is different from a second high voltage of the second buffer and a second low voltage of the second buffer.

20. The radio frequency switch circuit of claim 19, wherein the first voltage difference is lower than the second voltage difference, and the first high voltage is lower than the second high voltage.

* * * * *